(12) United States Patent
Ishizuka

(10) Patent No.: US 11,228,295 B2
(45) Date of Patent: Jan. 18, 2022

(54) FILTER CIRCUIT, FILTER CIRCUIT ELEMENT, AND MULTI/DEMULTIPLEXER

(71) Applicant: Murata Manufacturing Co., Ltd., Nagaokakyo (JP)

(72) Inventor: Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/855,246

(22) Filed: Apr. 22, 2020

(65) Prior Publication Data

US 2020/0252041 A1 Aug. 6, 2020

Related U.S. Application Data

(63) Continuation of application No. PCT/JP2018/041039, filed on Nov. 5, 2018.

(30) Foreign Application Priority Data

Nov. 30, 2017 (JP) .............................. JP2017-229855

(51) Int. Cl.
*H03H 7/01* (2006.01)
*H03H 7/09* (2006.01)

(52) U.S. Cl.
CPC ............ *H03H 7/0115* (2013.01); *H03H 7/09* (2013.01); *H03H 7/1791* (2013.01)

(58) Field of Classification Search
CPC .................. H03H 7/0115; H03H 7/09; H03H 2001/0085; H03H 7/427; H03H 7/065
(Continued)

(56) References Cited

U.S. PATENT DOCUMENTS

2005/0200431 A1* 9/2005 Lin ...................... H03H 7/0115
333/175
2010/0226355 A1 9/2010 Uejima
(Continued)

FOREIGN PATENT DOCUMENTS

JP 2014-027690 A 2/2014
WO 2009/069353 A1 6/2009
(Continued)

OTHER PUBLICATIONS

Official Communication issued in International Patent Application No. PCT/JP2018/041039, dated Dec. 25, 2018.

*Primary Examiner* — Rakesh B Patel
(74) *Attorney, Agent, or Firm* — Keating & Bennett, LLP

(57) ABSTRACT

A low pass filter includes a first inductor, a second inductor magnetic-field-coupled to the first inductor, a third inductor, and a first capacitor. The first inductor is electrically connected between a first port and an intermediate node, being a node to which the second inductor is electrically connected, between the first inductor and the second port. The second inductor is electrically connected between the intermediate node and a ground terminal. The third inductor is electrically connected between the intermediate node and the second port, and a first parallel resonant circuit is defined by the third inductor and the first capacitor. The first inductor and the second inductor are coupled to each other in such a relationship that a negative inductance is generated between the intermediate node and the third inductor due to magnetic field coupling between the first inductor and the second inductor.

17 Claims, 16 Drawing Sheets

(58) Field of Classification Search
USPC .................................. 333/175, 177, 181, 185
See application file for complete search history.

(56) References Cited

U.S. PATENT DOCUMENTS

| | | | |
|---|---|---|---|
| 2013/0207745 A1* | 8/2013 | Yun ...................... | H03H 7/0115 333/185 |
| 2015/0061791 A1* | 3/2015 | Imamura .............. | H03H 7/0115 333/185 |
| 2017/0331444 A1 | 11/2017 | Mori | |
| 2017/0373492 A1 | 12/2017 | Ueki | |
| 2018/0102752 A1* | 4/2018 | Kishimoto .............. | H01P 1/205 |
| 2018/0198433 A1* | 7/2018 | Mori ...................... | H03H 9/605 |

FOREIGN PATENT DOCUMENTS

| | | |
|---|---|---|
| WO | 2016/125515 A1 | 8/2016 |
| WO | 2017/159282 A1 | 9/2017 |

* cited by examiner

<COMPARATIVE EXAMPLE>

FIG. 10B <COMPARATIVE EXAMPLE>

FILTER CIRCUIT, FILTER CIRCUIT ELEMENT, AND MULTI/DEMULTIPLEXER

CROSS REFERENCE TO RELATED APPLICATIONS

This application claims the benefit of priority to Japanese Patent Application No. 2017-229855 filed on Nov. 30, 2017 and is a Continuation Application of PCT Application No. PCT/JP2018/041039 filed on Nov. 5, 2018. The entire contents of each application are hereby incorporated herein by reference.

BACKGROUND OF THE INVENTION

1. Field of the Invention

The present invention relates to a filter circuit including an inductor and a capacitor, a filter circuit element included in the filter circuit, and a multi/demultiplexer including the filter circuit.

2. Description of the Related Art

International Publication No. 2009/069353 describes a multi/demultiplexer which is provided in a front end circuit or the like to which an antenna is connected and which is formed by a low pass filter and a high pass filter.

The multi/demultiplexer described in International Publication No. 2009/069353 is formed by the low pass filter for passing a low-band communication signal and cutting off a high-band communication signal, and the high pass filter for transmitting the high-band communication signal and cutting off the low-band communication signal.

A typical circuit configuration of the low pass filter is a T-type filter in which an inductive reactance circuit is connected in series and a capacitive reactance circuit is shunt-connected. In such a low pass filter, when an inductance of the inductive reactance circuit connected in series is increased in order to increase attenuation in a stop frequency band (high-frequency band), a reactance change with respect to a frequency change is increased in a pass frequency band (low-frequency band), and it becomes difficult to achieve impedance matching over a wide band. Additionally, since the reactance is increased in the pass frequency band (low-frequency band), an insertion loss in the pass frequency band is increased.

A typical circuit configuration of a high pass filter is a T-type filter in which a capacitive reactance circuit is connected in series and an inductive reactance circuit is shunt-connected. In such a high pass filter, when an inductance of the inductive reactance circuit of the shunt connection is made to be small in order to increase attenuation in a stop frequency band (low-frequency band), a reactance becomes small also in the pass frequency band (high-frequency band), and the insertion loss in the pass frequency band increases.

SUMMARY OF THE INVENTION

Preferred embodiments of the present invention provide filter circuits and multi/demultiplexers including the same, in each of which attenuation in a stop frequency band is increased while significantly reducing or preventing an insertion loss in a pass frequency band, or in each of which the insertion loss in the pass frequency band is reduced while ensuring the attenuation in the stop frequency band.

Preferred embodiments of the present invention also provide filter circuits and multi/demultiplexers including the same, in each of which a problem of a band of impedance matching being narrowed is overcome by increasing an inductance of an inductor.

A filter circuit according to a preferred embodiment of the present invention includes a first port; a second port; a ground terminal; a first inductor electrically connected between the first port and the second port; a second inductor electrically connected between a node between the first inductor and the second port, and the ground terminal, and magnetic-field-coupled to the first inductor; a third inductor electrically connected between the second inductor and the second port; and a first capacitor electrically connected in parallel to the third inductor and defining a first parallel resonant circuit together with the third inductor, in which the first inductor and the second inductor are additive-polarity-coupled to each other.

The filter circuit described above is able to be used as a low pass filter by setting a resonant frequency of the first parallel resonant circuit to a stop frequency band. A mutual inductance due to the magnetic field coupling is added to a self-inductance of the first inductor. Therefore, the self-inductance of the first inductor is able to be set to be small. Since no loss is generated in the mutual inductance itself, an insertion loss in the pass frequency band (low-band) is reduced accordingly.

Additionally, since a negative inductance is electrically connected in series to the third inductor, a reactance in the pass frequency band between the node, to which the second inductor is electrically connected, between the first inductor and the second port, and the second port becomes small, and this effect also reduces the insertion loss due to mismatching in the pass frequency band (low-band).

The filter circuit may further include a second capacitor electrically connected in series to the second inductor and defining a series resonant circuit together with the second inductor. Thus, by setting the resonant frequency of the series resonant circuit within the stop frequency band, attenuation in the stop frequency band is able to be increased.

A filter circuit according to a preferred embodiment of the present invention includes a first port; a second port; a ground terminal; a first inductor electrically connected between the first port and the second port; a second inductor electrically connected between the first inductor and the second port, and magnetic-field-coupled to the first inductor; a third inductor electrically connected between a node between the first inductor and the second inductor, and the ground terminal; and a third capacitor electrically connected in parallel to the third inductor, and defining a second parallel resonant circuit together with the third inductor, in which the first inductor and the second inductor are additive-polarity-coupled to each other.

The filter circuit described above is able to be used as a high pass filter. A negative inductance due to the magnetic field coupling is added to a self-inductance of the third inductor. Therefore, a reactance in a stop frequency band of a circuit between the node, to which the second inductor is electrically connected, between the first inductor and the second port, and the ground terminal becomes small, matching in a stop frequency band (low-band) is increased, and attenuation is able to be increased.

Further, a mutual inductance due to the magnetic field coupling is added to a self-inductance of the first inductor and a self-inductance of the second inductor, respectively. Therefore, the self-inductance of the first inductor and the self-inductance of the second inductor are able to be set to be small, respectively. Since no loss is generated in the mutual inductance itself, an insertion loss in the pass frequency band (high-band) is reduced accordingly.

The filter circuit described above may further include a fourth capacitor electrically connected in parallel to the first inductor and defining a third parallel resonant circuit together with the first inductor and a mutual inductance due to the magnetic field coupling. Thus, by setting the resonant frequency of the third parallel resonant circuit within the stop frequency band, attenuation in the stop frequency band is able to be increased.

The filter circuit described above may further include a fifth capacitor electrically connected in parallel to the first inductor and defining a fourth parallel resonant circuit together with the first inductor and a mutual inductance due to the magnetic field coupling. Thus, by setting the resonant frequency of the fourth parallel resonant circuit to a frequency within the stop frequency band (high-band), the attenuation in the stop frequency band is able to be increased.

The filter circuit described above may further include a sixth capacitor electrically connected in parallel to the second inductor and defining a fifth parallel resonant circuit together with the second inductor and a mutual inductance due to the magnetic field coupling. Thus, by setting the resonant frequency of the fifth parallel resonant circuit to a frequency within the stop frequency band (low-band), the attenuation in the stop frequency band is able to be increased.

In the filter circuit described above, the first inductor and the second inductor may be provided in a multilayer body including a plurality of insulating substrates, the first inductor and the second inductor may include a plurality of conductor patterns provided in the plurality of insulating substrates, and the plurality of conductor patterns may overlap one another when viewed from a laminating direction of the insulating substrates. Accordingly, the first inductor and the second inductor having a high coupling coefficient therebetween are provided.

A filter circuit element according to a preferred embodiment of the present invention includes a first inductor; a second inductor which is magnetic-field-coupled to the first inductor; and a resonant circuit connection end which is electrically connected to a parallel resonant circuit, in which the first inductor and the second inductor are provided in a multilayer body of a plurality of insulating substrates; the first inductor and the second inductor include a plurality of conductor patterns provided in the plurality of insulating substrates; the plurality of conductor patterns overlap one another when viewed from a laminating direction of the insulating substrates; one end of the first inductor and one end of the second inductor are electrically connected to the resonant circuit connection end; and a negative mutual inductance is generated at a resonant circuit connection end side.

The filter circuit element described above is able to be used for the filter circuit, and a small filter circuit is able to be provided.

The filter circuit element described above may further include a capacitor electrically connected to the first inductor or the second inductor in series or in parallel. Accordingly, it is possible to treat as an element incorporating the first to sixth capacitors in addition to the first inductor and the second inductor, and it is possible to provide the filter circuit with a small number of components.

A multi/demultiplexer according to a preferred embodiment of the present invention includes filter circuits having different pass frequency bands and performs multi/demultiplexing of a plurality of signals having different frequency bands, in which at least one filter circuit among the plurality of filter circuits includes a first port, a second port, a ground terminal, a first inductor electrically connected between the first port and the second port, a second inductor electrically connected between a node between the first inductor and the second port, and the ground terminal, and magnetic-field-coupled to the first inductor, a third inductor electrically connected between the second inductor and the second port, and a capacitor electrically connected in parallel to the third inductor and defining a first parallel resonant circuit together with the third inductor, and the first inductor and the second inductor are additive-polarity-coupled to each other.

Accordingly, by including one filter described above as a low pass filter, a self-inductance of the first inductor is able to be set to be small, and an insertion loss in the pass frequency band (low-band) is reduced accordingly. Further, the negative inductance is electrically connected in series to the third inductor, a reactance in the pass frequency band between the node, to which the second inductor is electrically connected, between the first inductor and the second port, and the second port becomes small, and this effect also reduces an insertion loss due to mismatching in the pass frequency band (low-band).

A multi/demultiplexer according to a preferred embodiment of the present invention includes a plurality of filter circuits having different pass frequency bands and performs multi/demultiplexing of a plurality of signals having different frequency bands, in which at least one filter circuit among the plurality of filter circuits includes a first port, a second port, a ground terminal, a first inductor electrically connected between the first port and the second port, a second inductor electrically connected between the first inductor and the second port, a third inductor electrically connected between a node between the first inductor and the second inductor, and the ground terminal, and a capacitor electrically connected in parallel to the third inductor and defining a second parallel resonant circuit together with the third inductor, and the first inductor and the second inductor are additive-polarity-coupled to each other.

Accordingly, by including one filter described above as a high pass filter, a reactance in a stop frequency band of the circuit between the node, to which the second inductor is electrically connected, between the first inductor and the second port, and the ground is reduced, matching in the stop frequency band (low-band) is increased, and attenuation is increased. Further, a self-inductance of the first inductor and a self-inductance of the second inductor are able to be set to be small, and an insertion loss in the pass frequency band (high-band) is reduced accordingly.

According to preferred embodiments of the present invention, filter circuits, filter circuit elements included in the filter circuits, and multi/demultiplexers including the same, in each of which attenuation in a stop frequency band is increased while significantly reducing or preventing an insertion loss in a pass frequency band, or an insertion loss in the pass frequency band is reduced while ensuring the attenuation in the stop frequency band, are provided. Further, filter circuits, filter circuit elements included in the filter circuits, and multi/demultiplexers including the same, in each of which a problem of impedance matching being narrowed due to an increase in an inductance of an inductor is overcome, are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10B is a diagram showing frequency characteristics of an insertion loss of a diplexer of a comparative example.

DETAILED DESCRIPTION OF THE PREFERRED EMBODIMENTS

Figure 1A:
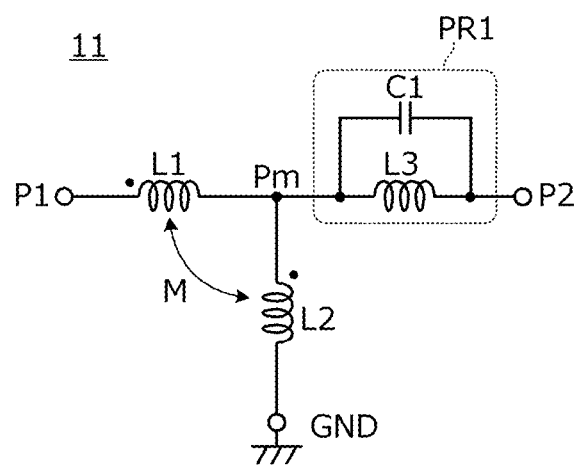
FIG. 1A is a circuit diagram of a low pass filter 11 according to a first preferred embodiment of the present invention.

Hereinafter, preferred embodiments of the present invention will be described with reference to the drawings and some specific examples. In the drawings, the same or similar elements are denoted by the same reference numerals. Although the preferred embodiments are shown separately in view of the explanation of the points or the ease of understanding, partial replacement or combination of the features shown in the different preferred embodiments is possible. In the second and subsequent preferred embodiments, description of matters common to the first preferred embodiment will be omitted, and only different points will be described. In particular, the same or similar advantageous effects of the same or similar features will not be repeatedly described for each preferred embodiment.

First Preferred Embodiment

In a first preferred embodiment of the present invention, an example applied to a low pass filter will be described.

Figure 1B:
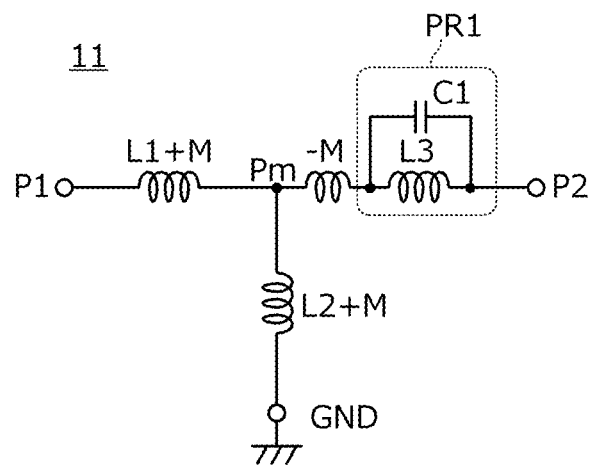
FIG. 1B is an equivalent circuit diagram of the low pass filter 11.

FIG. 1A is a circuit diagram of a low pass filter 11 according to the first preferred embodiment. FIG. 1B is an equivalent circuit diagram of the low pass filter 11.

The low pass filter 11 of the first preferred embodiment includes a first port P1, a second port P2, an intermediate node Pm between the first port P1 and the second port P2, and a ground terminal GND. Both the first port P1 and the second port P2 are input/output ports, and one is included in an input port, and the other is included in an output port.

Further, the low pass filter 11 includes a first inductor L1, a second inductor L2, a third inductor L3, and a first capacitor C1.

The first inductor L1 is electrically connected between the first port P1 and the intermediate node Pm. The second inductor L2 is electrically connected between the intermediate node Pm and the ground terminal GND. The third inductor L3 is electrically connected between the intermediate node Pm and the second port P2. The first capacitor C1 is electrically connected in parallel to the third inductor L3.

The low pass filter 11 is described as having the intermediate node Pm for the sake of convenience. In other words, in the low pass filter 11, the first inductor L1 is electrically connected between the first port P1 and the second port P2, and the second inductor L2 is electrically connected between a node between the first inductor L1 and the second port P2, and the ground terminal GND. Further, the third inductor L3 is electrically connected between the second inductor L2 and the second port P2.

The first inductor L1 and the second inductor L2 are coupled to each other with a polarity in which a negative inductance (−M) is generated between the intermediate node Pm and the second port P2. That is, the first inductor L1 and the second inductor L2 are coupled to each other with a polarity in which a mutual inductance is added to each other due to the magnetic field coupling between the first inductor L1 and the second inductor L2 (additive polarity coupling, cumulative coupling).

As shown in FIG. 1B, a negative inductance (−M) is generated between the intermediate node Pm and the second port P2 due to the coupling described above. An inductance between the first port P1 and the intermediate node Pm is represented by a combined inductance of a self-inductance of the first inductor L1 and the mutual inductance M due to the coupling between the first inductor L1 and the second inductor L2. Here, when the self-inductance of the first inductor L1 is represented by L1 and the mutual inductance is represented by M, the combined inductance is (L1+M).

An inductance between the intermediate node Pm and the ground terminal GND is expressed by a combined inductance of a self-inductance of the second inductor L2 and the mutual inductance M due to the coupling between the second inductor L2 and the first inductor L1. Here, when the self-inductance of the second inductor L2 is represented by L2 and the mutual inductance is represented by M, the combined inductance is (L2+M).

As shown in FIG. 1B, the first capacitor C1 and the third inductor L3 define a first parallel resonant circuit PR1. A resonant frequency of the first parallel resonant circuit PR1 is set to be a predetermined frequency within a stop frequency band. Therefore, in frequency characteristics of the low pass filter 11, an attenuation pole is generated at the resonant frequency of the first parallel resonant circuit PR1.

According to the first preferred embodiment, the mutual inductance (M) due to the magnetic field coupling is added to the self-inductance of the first inductor L1. Therefore, the self-inductance of the first inductor L1 is able to be set to be small. Since no loss is generated in the mutual inductance (M) itself, an insertion loss in a pass frequency band (low-band) is reduced accordingly.

Further, since the negative inductance (−M) is electrically connected in series to the third inductor L3, a reactance in the pass frequency band between the intermediate node Pm and the second port P2 becomes small, and accordingly an insertion loss due to mismatching in the pass frequency band (low-band) is thus reduced.

Second Preferred Embodiment

In a second preferred embodiment of the present invention, also, an example applied to a low pass filter will be described.

Figure 2A:
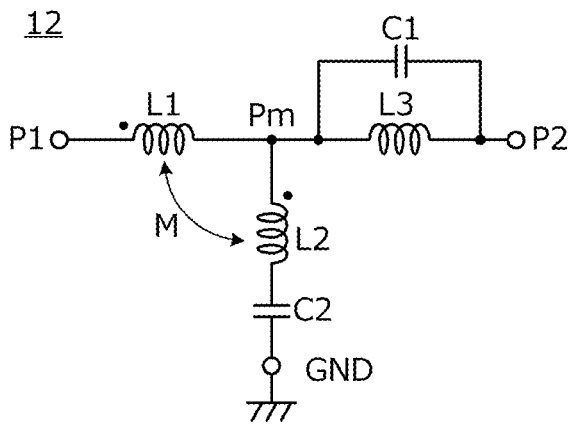
FIG. 2A is a circuit diagram of a low pass filter 12 according to a second preferred embodiment of the present invention.
Figure 2B:
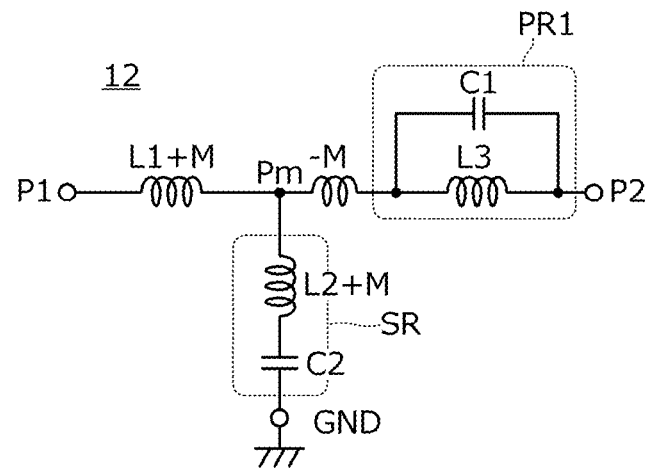
FIG. 2B is an equivalent circuit diagram of the low pass filter 12.

FIG. 2A is a circuit diagram of a low pass filter 12 according to the second preferred embodiment. FIG. 2B is an equivalent circuit diagram of the low pass filter 12.

The low pass filter 12 of the second preferred embodiment includes a first port P1, a second port P2, an intermediate node Pm between the first port P1 and the second port P2, and a ground terminal GND. Both the first port P1 and the second port P2 are input/output ports, and one is included in an input port, and the other is included in an output port.

Further, the low pass filter 12 includes a first inductor L1, a second inductor L2, a third inductor L3, a first capacitor C1, and a second capacitor C2.

The first inductor L1 is electrically connected between the first port P1 and the intermediate node Pm. The second inductor L2 is electrically connected between the intermediate node Pm and the ground terminal GND. The third inductor L3 is electrically connected between the intermediate node Pm and the second port P2. The first capacitor C1 is electrically connected in parallel to the third inductor L3. The second capacitor C2 is electrically connected in series to the second inductor L2.

The low pass filter 12 is described as having the intermediate node Pm for the sake of convenience. In other words, in the low pass filter 12, the first inductor L1 is electrically connected between the first port P1 and the second port P2, and the second inductor L2 is electrically connected between a node between the first inductor L1 and the second port P2, and the ground terminal GND. Further, the third inductor L3 is electrically connected between the second inductor L2 and the second port P2.

The low pass filter 12 is different from the low pass filter 11 shown in FIGS. 1A and 1B in that the low pass filter 12 includes the second capacitor C2.

The third inductor L3 and the first capacitor C1 define a first parallel resonant circuit PR1. A resonant frequency of the first parallel resonant circuit PR1 is set to be a predetermined frequency within a stop frequency band. Accordingly, in frequency characteristics of the low pass filter 12, an attenuation pole is generated at the resonant frequency of the first parallel resonant circuit PR1.

Further, as shown in FIG. 2B, the second capacitor C2 and a combined inductance (L2+M) define a series resonant circuit SR. The resonant frequency of the series resonant circuit SR is set to be a predetermined frequency within the stop frequency band. Therefore, in frequency characteristics of the low pass filter 12, an attenuation pole is generated also at the resonant frequency of the series resonant circuit SR.

Figure 3:
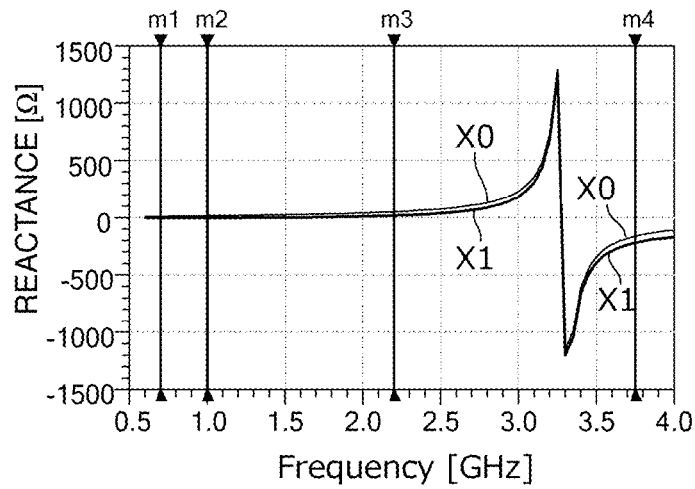
FIG. 3 is a diagram showing an effect of a negative inductance.

FIG. 3 is a diagram showing an effect of the negative inductance. The vertical axis represents a reactance between the intermediate node Pm and the second port P2 in FIGS. 2A and 2B, and the horizontal axis represents a frequency. The resonant frequency of the first parallel resonant circuit PR1 is approximately 3.3 GHz, for example. In FIG. 3, a reactance curve X0 represents characteristics when there is no coupling between the first inductor L1 and the second inductor L2 and there is no negative inductance, and a reactance curve X1 represents characteristics when there is the negative inductance. A cutoff frequency of the low pass filter of the second preferred embodiment is about 2.2 GHz, for example, and in a frequency band lower than the cutoff frequency, the reactance between the intermediate node Pm and the second port P2 becomes small due to the presence of the negative inductance. As a result, an insertion loss in the pass frequency band is reduced.

On the other hand, in a frequency band higher than the cutoff frequency (stop frequency band), the reactance between the intermediate node Pm and the second port P2 becomes large, and the attenuation thus becomes large. This leads to an increase in port-to-port isolation between a high pass filter and a low pass filter when the low pass filter defines a low pass filter portion of a diplexer described later.

The reactance at the frequency indicated by each of the markers m1 to m4 in FIG. 3 is as follows. Here, X0 represents the reactance when there is no negative inductance, and X1 represents the reactance when there is a negative inductance.

[m1] about 700 MHz
X0=about 9.51 Ω
X1=about −1.04 Ω
[m2] about 1.0 GHz
X0=about 14.30 Ω
X1=about −0.78 Ω
[m3] about 2.2 GHz
X0=about 51.66 Ω
X1=about 18.48 Ω

[m4] about 3.75 GHz
X0=about −161.33 Ω
X1=about −217.88 Ω

According to the second preferred embodiment, since the negative inductance (−M) is electrically connected in series to the third inductor L3, even in the frequency band higher than the resonant frequency of the first parallel resonant circuit PR1, the reactance of the circuit from the intermediate node Pm to the second port P2 becomes large, and the attenuation in the stop frequency band (high-band) thus becomes large. Otherwise, the same or similar advantageous effects as those described in the first preferred embodiment are able to be provided.

Figure 4A:
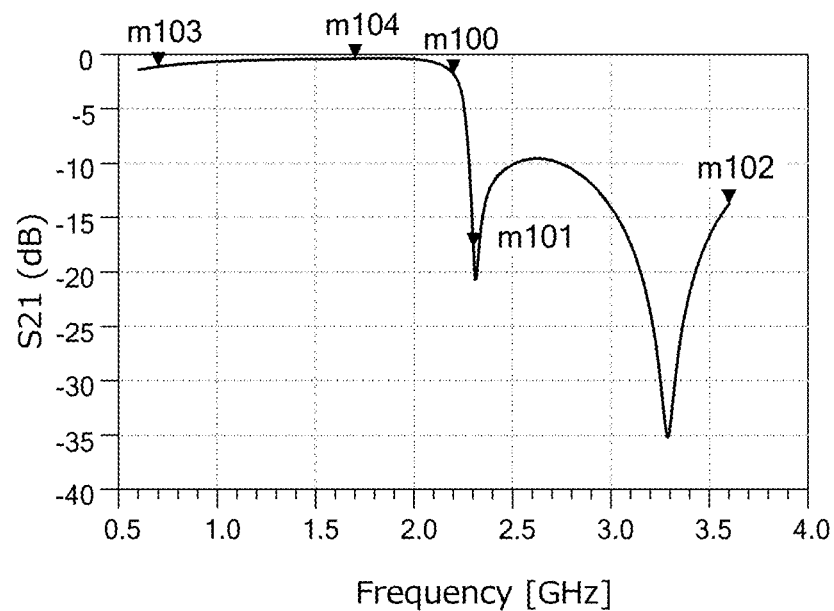
FIG. 4A is a diagram showing bandpass characteristics of the low pass filter 12 according to the second preferred embodiment of the present invention.
Figure 4B:
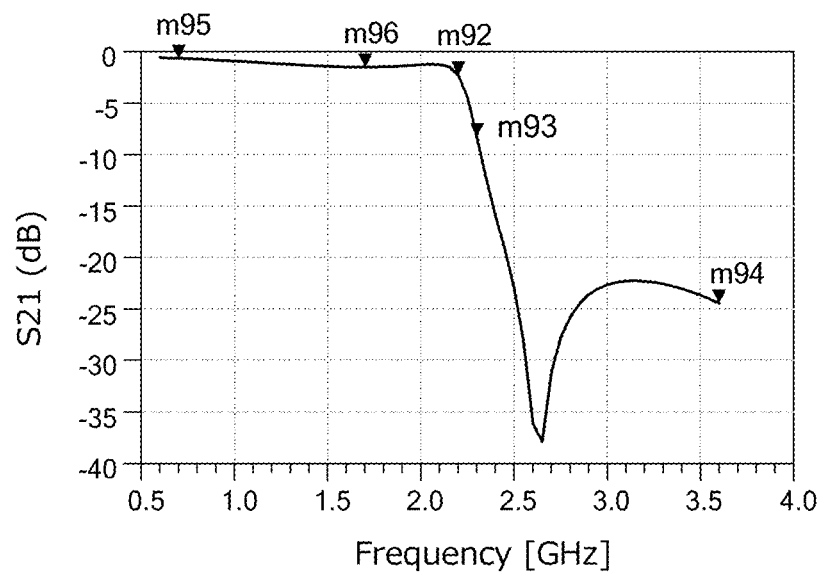
FIG. 4B is a diagram showing bandpass characteristics of a low pass filter of a comparative example.

FIG. 4A is a diagram showing bandpass characteristics of the low pass filter 12 according to the second preferred embodiment. FIG. 4B is a diagram showing bandpass characteristics of a low pass filter of a comparative example. In the low pass filter of the comparative example, there is no coupling between the first inductor L1 and the second inductor L2 in FIG. 2A, that is, there is no negative inductance (−M) in FIG. 2B.

In FIGS. 4A and 4B, the vertical axis represents an insertion loss, and the horizontal axis represents a frequency. In FIG. 4A, the attenuation pole at the frequency of about 3.3 GHz is due to the resonance of the first parallel resonant circuit PR1 shown in FIG. 2B. Further, the attenuation pole at the frequency of about 2.3 GHz is due to the resonance of the series resonant circuit SR.

The insertion loss at each marker in FIG. 4A is as follows.
[m103] about 700 MHz
about −1.082 dB
[m104] about 1.7 GHz
about −0.348 dB
[m100] about 2.2 GHz
about −1.746 dB
[m101] about 2.3 GHz
about −17.708 dB
[m102] about 3.6 GHz
about −13.693 dB The insertion loss at each marker in FIG. 4B is as follows.
[m95] about 700 MHz
about −0.64 dB
[m96] about 1.7 GHz
about −1.498 dB
[m92] about 2.2 GHz
about −2.262 dB
[m93] about 2.3 GHz
about −8.297 dB
[m94] about 3.6 GHz
about −24.407 dB As is apparent from the comparison between the marker m100 in FIG. 4A and the marker m92 in FIG. 4(B), the insertion loss in the low-band is improved by about −1.746−(−2.262)=0.516 dB. As is apparent from the comparison between the marker m101 in FIG. 4A and the marker m93 in FIG. 4B, the attenuation is also improved by about −8.297−(−17.708)=9.411 dB (approximately 10 dB) in a band in a vicinity of the cutoff frequency in which the improvement is most difficult.

Third Preferred Embodiment

In a third preferred embodiment of the present invention, an example applied to a high pass filter will be described.

Figure 5A:
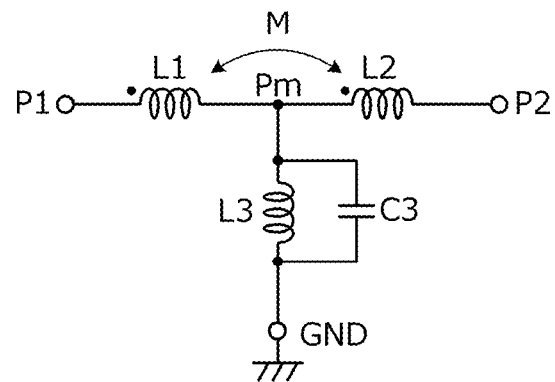
FIG. 5A is a circuit diagram of a high pass filter 13 according to a third preferred embodiment of the present invention.
Figure 5B:
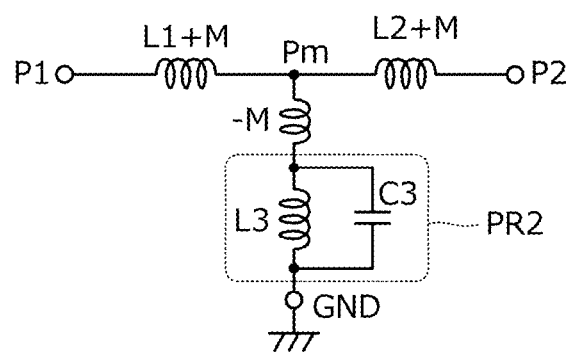
FIG. 5B is an equivalent circuit diagram of the high pass filter 13.

FIG. 5A is a circuit diagram of a high pass filter 13 according to the third preferred embodiment. FIG. 5B is an equivalent circuit diagram of the high pass filter 13.

The high pass filter 13 of the third preferred embodiment includes a first port P1, a second port P2, an intermediate node Pm between the first port P1 and the second port P2, and a ground terminal GND. Both the first port P1 and the second port P2 are input/output ports, and one is included in an input port, and the other is included in an output port.

Further, the high pass filter 13 includes a first inductor L1, a second inductor L2, a third inductor L3, and a third capacitor C3.

The first inductor L1 is electrically connected between the first port P1 and the intermediate node Pm. The second inductor L2 is electrically connected between the intermediate node Pm and the second port P2. The third inductor L3 is electrically connected between the intermediate node Pm and the ground terminal GND. The third capacitor C3 is electrically connected in parallel to the third inductor L3.

The high pass filter 13 is described as having the intermediate node Pm for the sake of convenience. In other words, in the high pass filter 13, the first inductor L1 is electrically connected between the first port P1 and the second port P2, and the second inductor L2 is electrically connected between the first inductor L1 and the second port P2. Further, the third inductor L3 is electrically connected between a node between the first inductor L1 and the second inductor L2, and the ground terminal GND.

The first inductor L1 and the second inductor L2 are coupled to each other with a polarity in which a negative inductance is generated between the intermediate node Pm and the ground terminal GND. That is, the first inductor L1 and the second inductor L2 are coupled to each other with a polarity in which a mutual inductance is added to each other due to the magnetic field coupling between the first inductor L1 and the second inductor L2 (additive polarity coupling, cumulative coupling).

As shown in FIG. 5B, a negative inductance (−M) is generated between the intermediate node Pm and the ground terminal GND due to the coupling described above. An inductance between the first port P1 and the intermediate node Pm is represented by a combined inductance of a self-inductance of the first inductor L1 and the mutual inductance M due to the coupling between the first inductor L1 and the second inductor L2. Here, when the self-inductance of the first inductor L1 is represented by L1 and the mutual inductance is represented by M, the combined inductance is (L1+M).

An inductance between the intermediate node Pm and the second port P2 is represented by a combined inductance of a self-inductance of the second inductor L2 and the mutual inductance M due to the coupling between the second inductor L2 and the first inductor L1. Here, when the self-inductance of the second inductor L2 is represented by L2 and the mutual inductance is represented by M, the combined inductance is (L2+M).

As shown in FIG. 5B, the third capacitor C3 and the third inductor L3 define a second parallel resonant circuit PR2. A resonant frequency of the second parallel resonant circuit PR2 is set to be a predetermined frequency within a stop frequency band (low-band). Therefore, in frequency characteristics of the high pass filter 13, an attenuation pole is generated at the resonant frequency of the second parallel resonant circuit PR2.

According to the third preferred embodiment, the negative inductance (−M) due to the magnetic field coupling is added to a self-inductance of the third inductor L3. Therefore, a reactance in the stop frequency band of the circuit between the intermediate node Pm and the ground terminal GND becomes small, and attenuation in the stop frequency band (low-band) is able to be increased.

Further, the mutual inductance (M) due to the magnetic field coupling is added to the self-inductance of the first inductor L1 and the self-inductance of the second inductor L2, respectively. Therefore, the self-inductance of the first inductor L1 and the self-inductance of the second inductor L2 are able to be set to be small, respectively. Since no loss is generated in the mutual inductance itself, an insertion loss in the pass frequency band (high-band) is reduced accordingly.

Fourth Preferred Embodiment

In a fourth preferred embodiment of the present invention, also, an example applied to a high pass filter will be described.

Figure 6A:
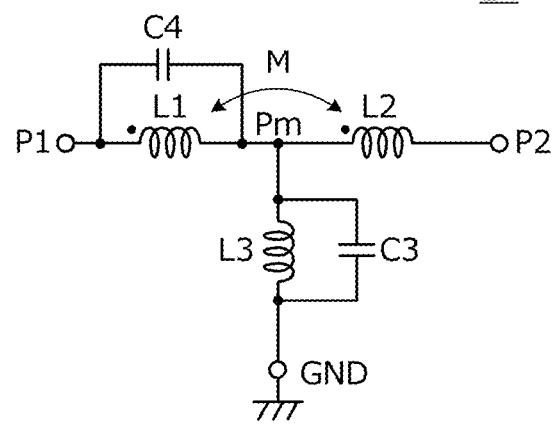
FIG. 6A is a circuit diagram of a high pass filter 14 according to a fourth preferred embodiment of the present invention.
Figure 6B:
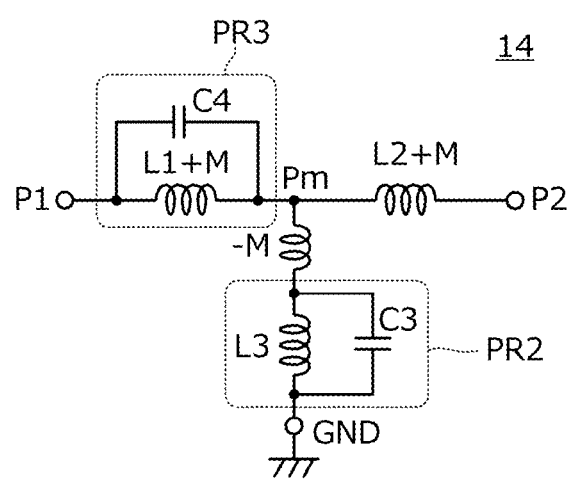
FIG. 6B is an equivalent circuit diagram of the high pass filter 14.

FIG. 6A is a circuit diagram of a high pass filter 14 according to the fourth preferred embodiment. FIG. 6B is an equivalent circuit diagram of the high pass filter 14.

The high pass filter 14 of the fourth preferred embodiment includes a first port P1, a second port P2, an intermediate node Pm between the first port P1 and the second port P2, and a ground terminal GND. Both the first port P1 and the second port P2 are input/output ports, and one is included in an input port, and the other is included in an output port.

Further, the high pass filter 14 includes a first inductor L1, a second inductor L2, a third inductor L3, a third capacitor C3, and a fourth capacitor C4.

The first inductor L1 is electrically connected between the first port P1 and the intermediate node Pm. The second inductor L2 is electrically connected between the intermediate node Pm and the second port P2. The third inductor L3 is electrically connected between the intermediate node Pm and the ground terminal GND. The third capacitor C3 is electrically connected in parallel to the third inductor L3. The fourth capacitor C4 is electrically connected in parallel to the first inductor L1.

The high pass filter 14 is described as having the intermediate node Pm for the sake of convenience. In other words, in the high pass filter 14, the first inductor L1 is electrically connected between the first port P1 and the second port P2, and the second inductor L2 is electrically connected between the first inductor L1 and the second port P2. Further, the third inductor L3 is electrically connected between a node between the first inductor L1 and the second inductor L2, and the ground terminal GND.

The high pass filter 14 is different from the high pass filter 13 shown in FIGS. 5A and 5B in that the high pass filter 14 includes the fourth capacitor C4.

A resonant frequency of the second parallel resonant circuit PR2 by the third inductor L3 and the third capacitor C3 is set to be a predetermined frequency within a pass frequency band (high-band). In a stop frequency band, it is shunted to the ground via a low reactance due to combination of a negative inductance (−M) and the third inductor L3. Accordingly, attenuation in the stop frequency band (low-band) is increased.

Further, as shown in FIG. 6B, the fourth capacitor C4 and a combined inductance (L1+M) define a third parallel resonant circuit PR3. A resonant frequency of the third parallel resonant circuit PR3 is set to be a predetermined frequency within the stop frequency band (low-band). Therefore, the high pass filter 14 has an attenuation pole at the resonant frequency of the third parallel resonant circuit PR3.

Fifth Preferred Embodiment

In a fifth preferred embodiment of the present invention, an example applied to a low pass filter will be described.

Figure 7A:
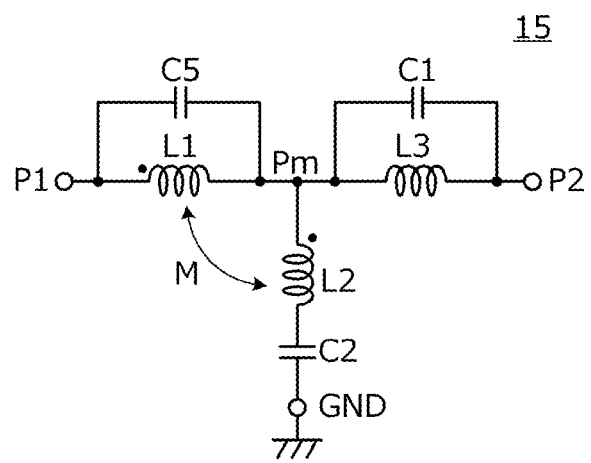
FIG. 7A is a circuit diagram of a low pass filter 15 according to a fifth preferred embodiment of the present invention.
Figure 7B:
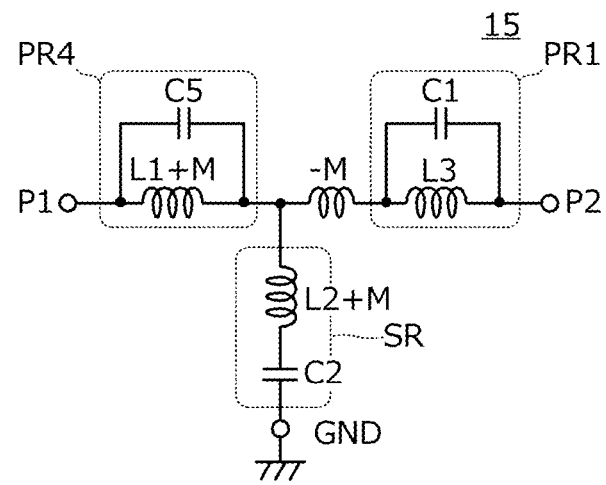
FIG. 7B is an equivalent circuit diagram of the low pass filter 15.

FIG. 7A is a circuit diagram of a low pass filter 15. FIG. 7B is an equivalent circuit diagram of the low pass filter 15.

The low pass filter 15 of the fifth preferred embodiment includes a first port P1, a second port P2, an intermediate node Pm between the first port P1 and the second port P2, and a ground terminal GND. Both the first port P1 and the second port P2 are input/output ports, and one is included in an input port, and the other is included in an output port.

Further the low pass filter 15 includes a first inductor L1, a second inductor L2, a third inductor L3, a first capacitor C1, a second capacitor C2, and a fifth capacitor C5.

The first inductor L1 is electrically connected between the first port P1 and the intermediate node Pm. The second inductor L2 is electrically connected between the intermediate node Pm and the ground terminal GND. The third inductor L3 is electrically connected between the intermediate node Pm and the second port P2. The first capacitor C1 is electrically connected in parallel to the third inductor L3. The second capacitor C2 is electrically connected in series to the second inductor L2. The fifth capacitor C5 is electrically connected in parallel to the first inductor L1.

The low pass filter 15 is described as having the intermediate node Pm for the sake of convenience. In other words, in the low pass filter 15, the first inductor L1 is electrically connected between the first port P1 and the second port P2, and the second inductor L2 is electrically connected between a node between the first inductor L1 and the second port P2, and the ground terminal GND. Further, the third inductor L3 is electrically connected between the second inductor L2 and the second port P2.

The low pass filter 15 is different from the low pass filter 12 shown in FIGS. 2A and 2B in that the low pass filter 15 includes the fifth capacitor C5. According to the fifth preferred embodiment, the combined inductor (L1+M) by a mutual inductance (M) due to the magnetic field coupling between the first inductor L1 and the second inductor L2, and the first inductor L1, and the fifth capacitor C5 define a fourth parallel resonant circuit PR4. A resonant frequency of the fourth parallel resonant circuit PR4 is set to be a predetermined frequency within a stop frequency band (high-band). Accordingly, in frequency characteristics of the low pass filter 15, an attenuation pole is generated also at the resonant frequency of the fourth parallel resonant circuit PR4.

Sixth Preferred Embodiment

In a sixth preferred embodiment of the present invention, an example applied to a high pass filter will be described.

Figure 8A:
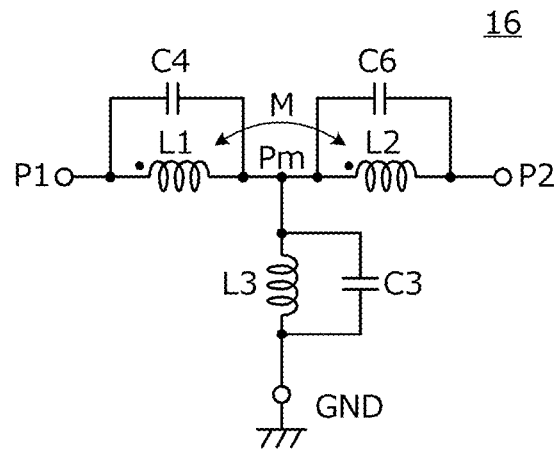
FIG. 8A is a circuit diagram of a high pass filter 16 according to a sixth preferred embodiment of the present invention.
Figure 8B:
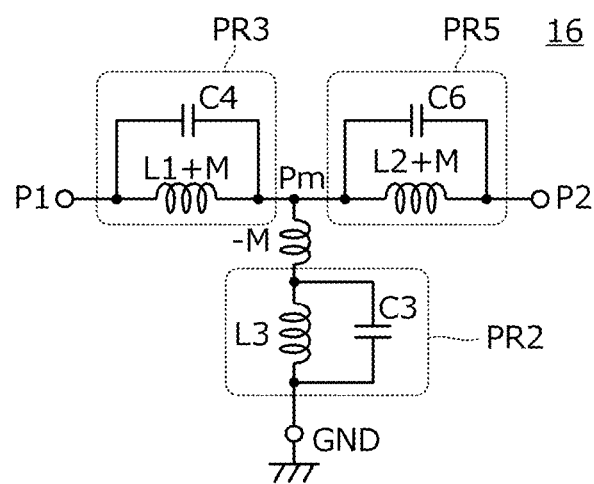
FIG. 8B is an equivalent circuit diagram of the high pass filter 16.

FIG. 8A is a circuit diagram of a high pass filter 16. FIG. 8B is an equivalent circuit diagram of the high pass filter 16.

The high pass filter 16 of the sixth preferred embodiment includes a first port P1, a second port P2, an intermediate node Pm between the first port P1 and the second port P2, and a ground terminal GND. Both the first port P1 and the second port P2 are input/output ports, and one is used as an input port, and the other is included in an output port.

Further, the high pass filter 16 includes a first inductor L1, a second inductor L2, a third inductor L3, a third capacitor C3, a fourth capacitor C4, and a sixth capacitor C6.

The first inductor L1 is electrically connected between the first port P1 and the intermediate node Pm. The second inductor L2 is electrically connected between the intermediate node Pm and the second port P2. The third inductor L3 is electrically connected between the intermediate node Pm and the ground terminal GND. The third capacitor C3 is electrically connected in parallel to the third inductor L3.

The fourth capacitor C4 is electrically connected in parallel to the first inductor L1. The sixth capacitor C6 is electrically connected in parallel to the second inductor L2.

The high pass filter 16 is described as having the intermediate node Pm for the sake of convenience. In other words, in the high pass filter 16, the first inductor L1 is electrically connected between the first port P1 and the second port P2, and the second inductor L2 is electrically connected between the first inductor L1 and the second port P2. Further, the third inductor L3 is electrically connected between a node between the first inductor L1 and the second inductor L2, and the ground terminal GND.

The high pass filter 16 is different from the high pass filter 14 shown in FIGS. 6A and 6B in that the high pass filter 16 includes the sixth capacitor C6. According to the sixth preferred embodiment, a combined inductor (L2+M) by a mutual inductance (M) due to the magnetic field coupling between the first inductor L1 and the second inductor L2, and the second inductor L2, and the sixth capacitor C6 define a fifth parallel resonant circuit PR5. A resonant frequency of the fifth parallel resonant circuit PR5 is set to be a predetermined frequency within a stop frequency band. Accordingly, in frequency characteristics of the high pass filter 16, an attenuation pole is generated also at the resonant frequency of the fifth parallel resonant circuit PR5.

Seventh Preferred Embodiment

In a seventh preferred embodiment of the present invention, an example of a diplexer (multi/demultiplexer) will be described.

Figure 9:
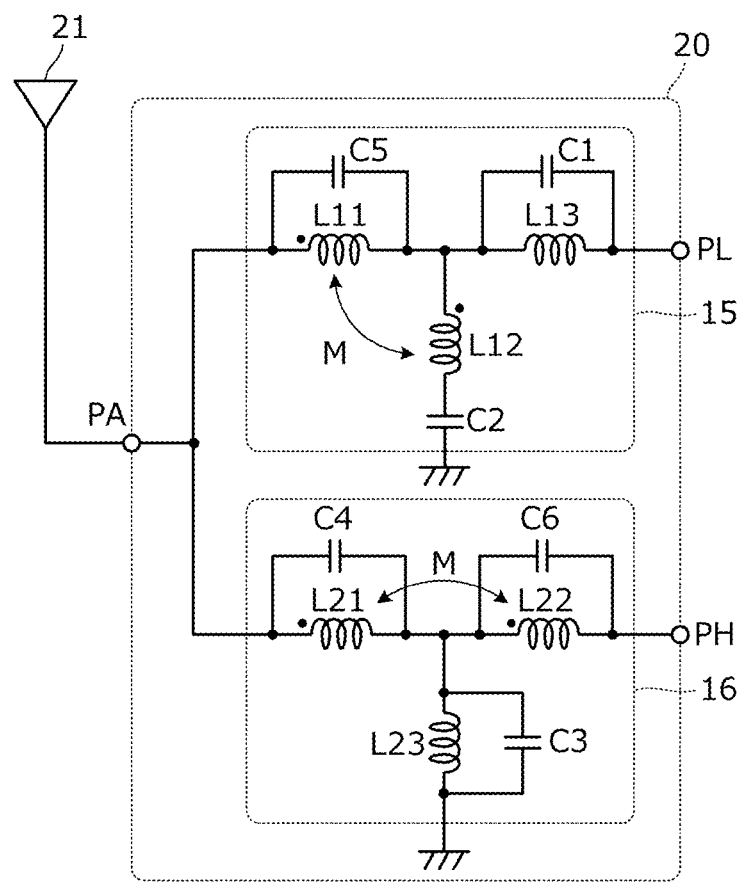
FIG. 9 is a circuit diagram of a diplexer 20 according to a seventh preferred embodiment of the present invention.

FIG. 9 is a circuit diagram of a diplexer 20 according to the seventh preferred embodiment. The diplexer 20 includes an antenna port PA, a low-band communication circuit connection port PL, and a high-band communication circuit connection port PH. An antenna 21 is electrically connected to the antenna port PA. In the diplexer 20, a low pass filter 15 is provided between the antenna port PA and the low-band communication circuit connection port PL, and a high pass filter 16 is provided between the antenna port PA and the high-band communication circuit connection port PH.

The low pass filter 15 is as described in the fifth preferred embodiment. Further, the high pass filter 16 is as described in the sixth preferred embodiment. However, in FIG. 9, in the low pass filter 15, a first inductor is represented by L11, a second inductor is represented by L12, and a third inductor is represented by L13, respectively. In addition, in the high pass filter 16, a first inductor is represented by L21, a second inductor is represented by L22, and a third inductor is represented by L23, respectively. Instead of the low pass filter 15 and the high pass filter 16 of the seventh preferred embodiment, the low pass filter or the high pass filter described in other preferred embodiments may be used.

In order to prevent interference due to electrically connecting the low pass filter 15 and the high pass filter 16 as shown in FIG. 9, an open filter (T-type filter) including no shunt-connected element at the first stage or the last stage in the antenna port PA is provided.

Figure 10A:
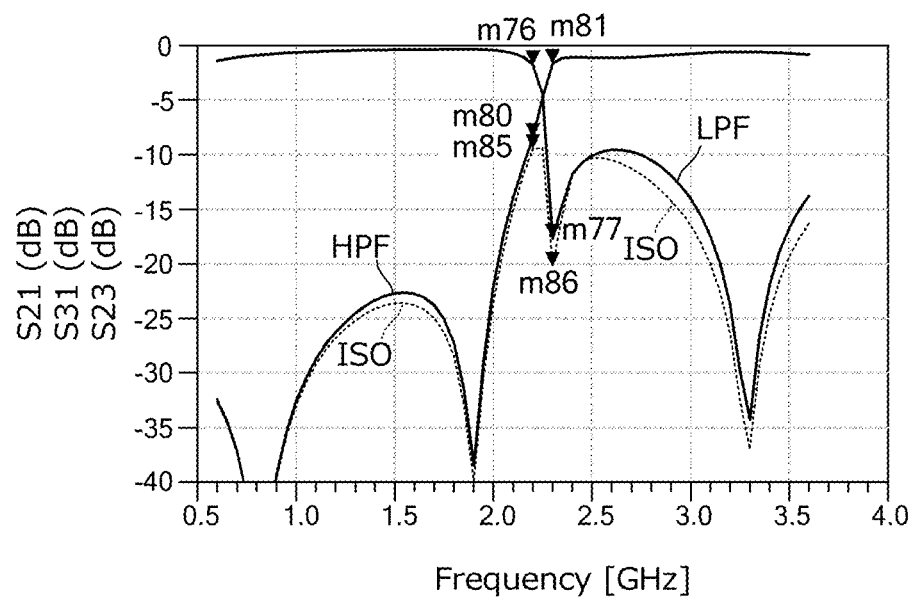
FIG. 10A is a diagram showing frequency characteristics of an insertion loss of the diplexer 20 according to the seventh preferred embodiment of the present invention.
Figure 10A:
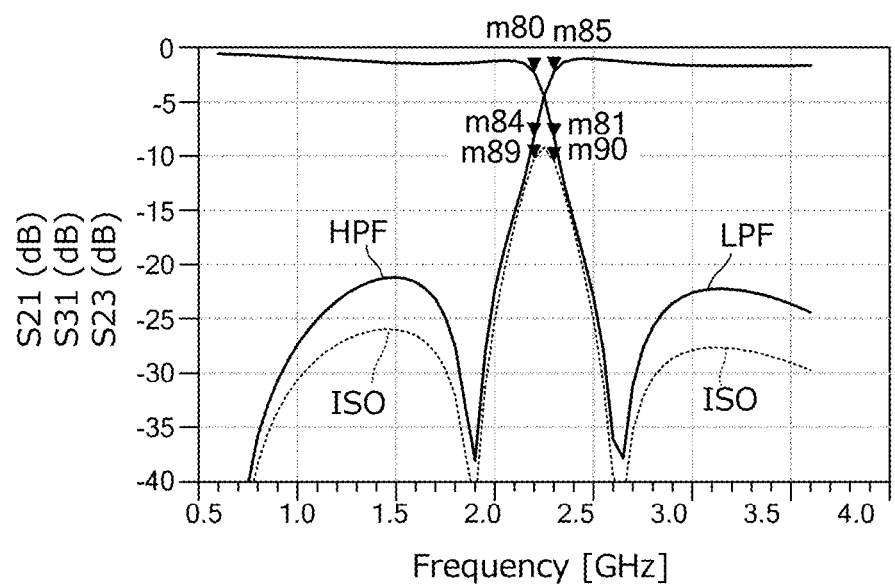

FIG. 10A is a diagram showing an insertion loss and frequency characteristics of isolation in the diplexer 20 according to the seventh preferred embodiment. FIG. 10B is a diagram showing an insertion loss and frequency characteristics of isolation in a diplexer of a comparative example. In the diplexer of the comparative example, in FIG. 9, there is no magnetic field coupling between the first inductor L11 and the second inductor L12, and there is no magnetic field coupling between the first inductor L21 and the second inductor L22. In FIGS. 10A and 10B, LPF indicates the insertion loss of the low pass filter, HPF indicates the insertion loss of the high pass filter, and ISO indicates the port-to-port isolation between the low-band communication circuit connection port PL and the high-band communication circuit connection port PH.

In the diplexer of the comparative example shown in FIG. 10B, there is an insertion loss of about −1.5 dB or more both in the low-band and the high-band, and the insertion loss of approximately −2.3 dB is generated at pass band ends (shoulder portions, positions at markers m80 and m85). Further, the port-to-port isolation between the low-band communication circuit connection port PL and the high-band communication circuit connection port PH is only about −8 dB at the pass band ends (positions at markers m89 and m90).

On the other hand, in the diplexer 20 of the seventh preferred embodiment, as shown in FIG. 10A, the insertion loss in the pass frequency band is less than about −1.0 dB both in the low-band and the high-band, and the insertion loss of approximately −1.7 dB is only generated at the pass band ends (shoulder portions, positions at markers m76 and m81). In addition, the port-to-port isolation between the low-band communication circuit connection port PL and the high-band communication circuit connection port PH at the pass band end (position at marker m86) is about −20 dB.

As is clear from a comparison between FIGS. 10A and 10B, attenuation of the low pass filter 15 is improved by about 0.5 dB at about 2.2 GHz which is the pass band end, and also an average attenuation over the entire pass frequency band is improved by about 0.5 dB. Attenuation of the high pass filter 16 is improved by approximately about 0.6 dB at about 2.3 GHz which is the pass band end. Further, the isolation between the low-band signal and the high-band signal at about 2.3 GHz is improved by about 10 dB.

Eighth Preferred Embodiment

In an eighth preferred embodiment of the present invention, an example of a filter circuit element is described.

Figure 11:
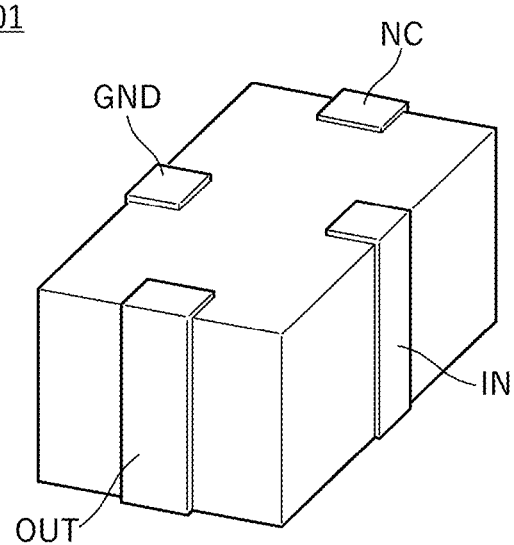
FIG. 11 is an external perspective view of a filter circuit element 101 according to an eighth preferred embodiment of the present invention.
Figure 12:
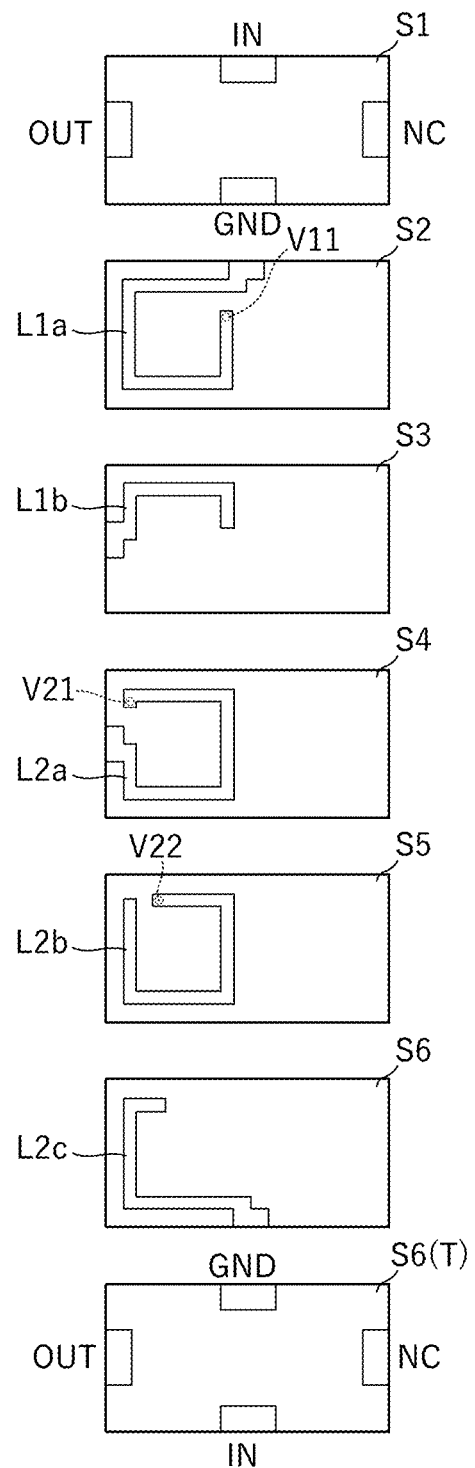
FIG. 12 is an exploded plan view of the filter circuit element 101.
Figure 13:
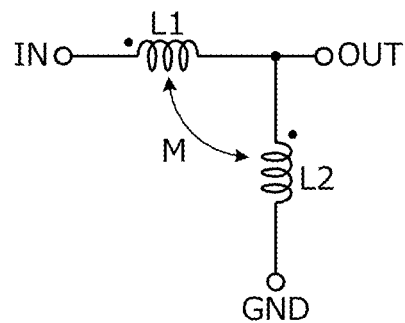
FIG. 13 is a circuit diagram of the filter circuit element 101.

FIG. 11 is an external perspective view of a filter circuit element 101 according to the eighth preferred embodiment. FIG. 12 is an exploded plan view of the filter circuit element 101. FIG. 13 is a circuit diagram of the filter circuit element 101.

The filter circuit element 101 defines the first inductor L1 and the second inductor L2 in the low pass filter 11 shown in FIG. 1A, the low pass filter 12 shown in FIG. 2A, the high pass filter 13 shown in FIG. 5A, the high pass filter 14 shown in FIG. 6A, the low pass filter 15 shown in FIG. 7A, the high pass filter 16 shown in FIG. 8A, and the like.

The filter circuit element 101 is defined by a rectangular parallelepiped or substantially rectangular parallelepiped multilayer body in which a plurality of insulating substrates are laminated. The filter circuit element 101 includes terminals IN, OUT, GND, and NC provided at the center or approximate center of four sides, respectively in plan view. Here, the terminal NC is an empty terminal not electrically connected to the circuit.

As shown in FIG. 12, the filter circuit element 101 is a multilayer body including insulating substrates S1 to S6 that are laminated. In FIG. 12, a lower surface of each of the insulating substrates S1 to S6 is shown. In FIG. 12, an insulating substrate S6(T) shows an upper surface of the insulating substrate S6.

As shown in FIG. 12, conductor patterns L1a and L1b that define a first inductor are provided on the insulating substrates S2 and S3. Further, conductor patterns L2a, L2b, and L2c that define a second inductor are provided on the insulating substrates S4, S5, and S6. The plurality of conductor patterns L1a, L1b, L2a, L2b, and L2c overlap one another when viewed from a laminating direction of the insulating substrates S1 to S6. That is, an opening of a loop defining the first inductor L1 and an opening of a loop defining the second inductor L2 overlap each other. Additionally, the conductor pattern L1a and the conductor pattern L1b are electrically connected to each other via an interlayer connection conductor V11, and the first inductor L1 is defined by the conductor patterns L1a and L1b and the interlayer connection conductor V11. Further, the conductor pattern L2a and the conductor pattern L2b are electrically connected to each other via an interlayer connection conductor V21, and the conductor pattern L2b and the conductor pattern L2c are electrically connected to each other via an interlayer connection conductor V22, and the second inductor L2 is defined by the conductor patterns L2a, L2b, and L2c and the interlayer connection conductors V21 and V22.

As described above, in the filter circuit element 101, the first inductor L1 and the second inductor L2 are provided in a multilayer body of a plurality of insulating substrates laminated.

In FIG. 13, the OUT terminal which is a connection end between the first inductor L1 and the second inductor L2 corresponds to a "resonant circuit connection end".

Accordingly, it is possible to improve coupling between the first inductor L1 and the second inductor L2. Further, by including such a filter circuit element, the filter circuit is able to be simplified.

When the low pass filter 11 described in the first preferred embodiment includes the filter circuit element of the eighth preferred embodiment, the first inductor L1 and the second inductor L2 which are magnetic-field-coupled to each other as shown in FIG. 1A are provided by the filter circuit element 101.

Ninth Preferred Embodiment

In a ninth preferred embodiment of the present invention, an example of a filter circuit element including a capacitor electrically connected in series to a second inductor L2 is described.

Figure 14:
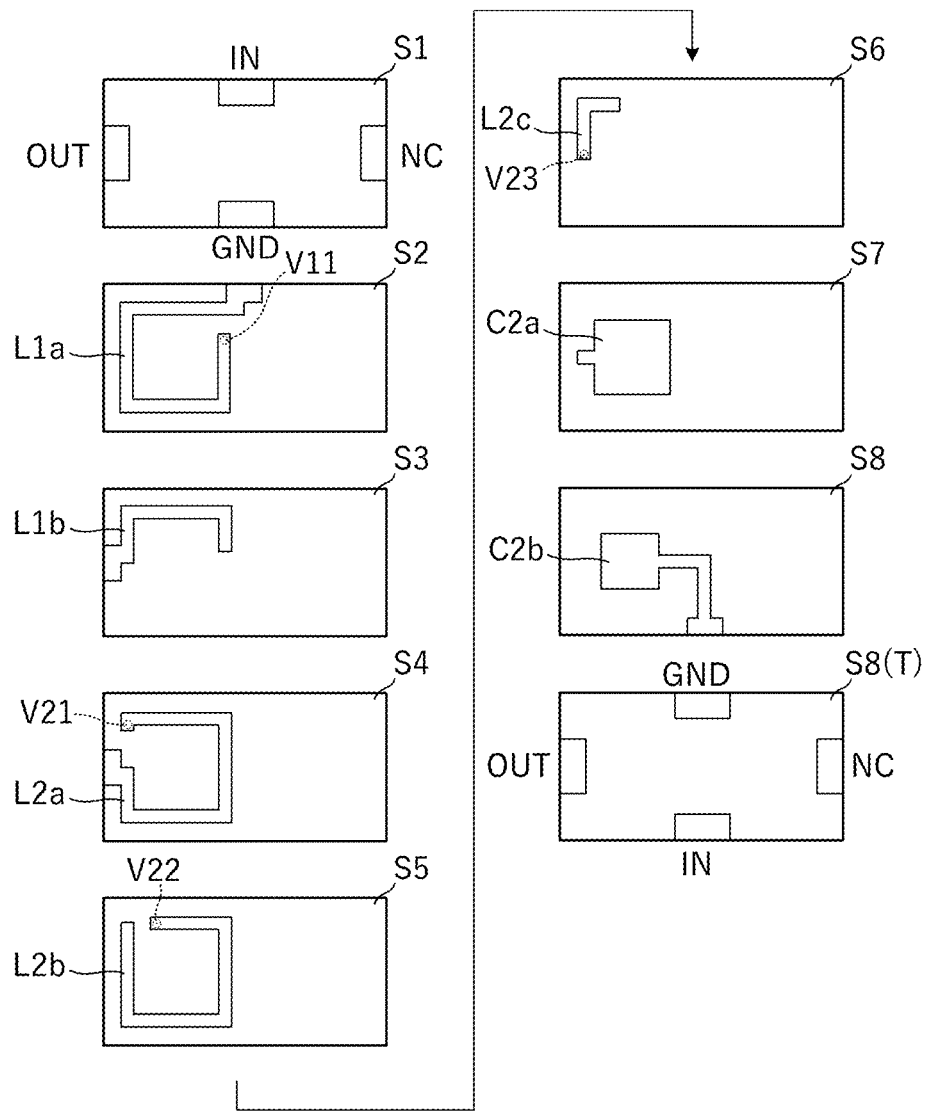
FIG. 14 is an exploded plan view of a filter circuit element according to a ninth preferred embodiment of the present invention.
Figure 15:
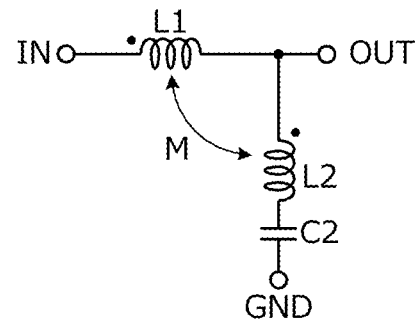
FIG. 15 is a circuit diagram of a filter circuit element 102 according to the ninth preferred embodiment of the present invention.

FIG. 14 is an exploded plan view of a filter circuit element according to the ninth preferred embodiment. FIG. 15 is a circuit diagram of a filter circuit element 102.

The filter circuit element 102 defines the first inductor L1, the second inductor L2, and the second capacitor C2 in the low pass filter 12 shown in FIG. 2A, the low pass filter 15 shown in FIG. 7A, and the like. An external appearance of the filter circuit element 102 is the same as or similar to that shown in FIG. 11.

As shown in FIG. 14, the filter circuit element 102 is a multilayer body including insulating substrates S1 to S8 that are laminated. In FIG. 14, a lower surface of each of the insulating substrates S1 to S8 is shown. In FIG. 14, an insulating substrate S8(T) shows an upper surface of the insulating substrate S8.

As shown in FIG. 14, conductor patterns L1a and L1b that define a first inductor are provided on the insulating substrates S2 and S3. Conductor patterns L2a, L2b, and L2c that define a second inductor are provided on the insulating substrates S4, S5, and S6. Additionally, conductor patterns C2a and C2b that define a second capacitor are provided on the insulating substrates S7 and S8.

The plurality of conductor patterns L1a, L1b, L2a, L2b, and L2c overlap one another when viewed from a laminating direction of the insulating substrates S1 to S6. That is, an opening of a loop defining the first inductor L1 and an opening of a loop defining the second inductor L2 overlap each other. Additionally, the conductor pattern L1a and the conductor pattern L1b are electrically connected to each other via an interlayer connection conductor V11, and the first inductor L1 is defined by the conductor patterns L1a and L1b, and the interlayer connection conductor V11. The conductor pattern L2a and the conductor pattern L2b are electrically connected to each other via an interlayer connection conductor V21, and the conductor pattern L2b and the conductor pattern L2c are electrically connected to each other via an interlayer connection conductor V22, and the second inductor L2 is formed by the conductor patterns L2a, L2b, and L2c and the interlayer connection conductors V21 and V22. Further, the conductor pattern L2c and the conductor pattern C2a are electrically connected to each other via an interlayer connection conductor V23.

The conductor patterns C2a and C2b that define the second capacitor are opposed to each other to define the second capacitor C2.

According to the ninth preferred embodiment, an element incorporating the second capacitor C2 together with the first inductor L1 and the second inductor L2, which are magnetic-field-coupled to each other, is able to be treated as a single component, and the filter circuit is able to be provided with a small number of components.

Tenth Preferred Embodiment

In a 10th preferred embodiment of the present invention, an example of a filter circuit element including a capacitor electrically connected in parallel to the first inductor L1 is described.

Figure 16:
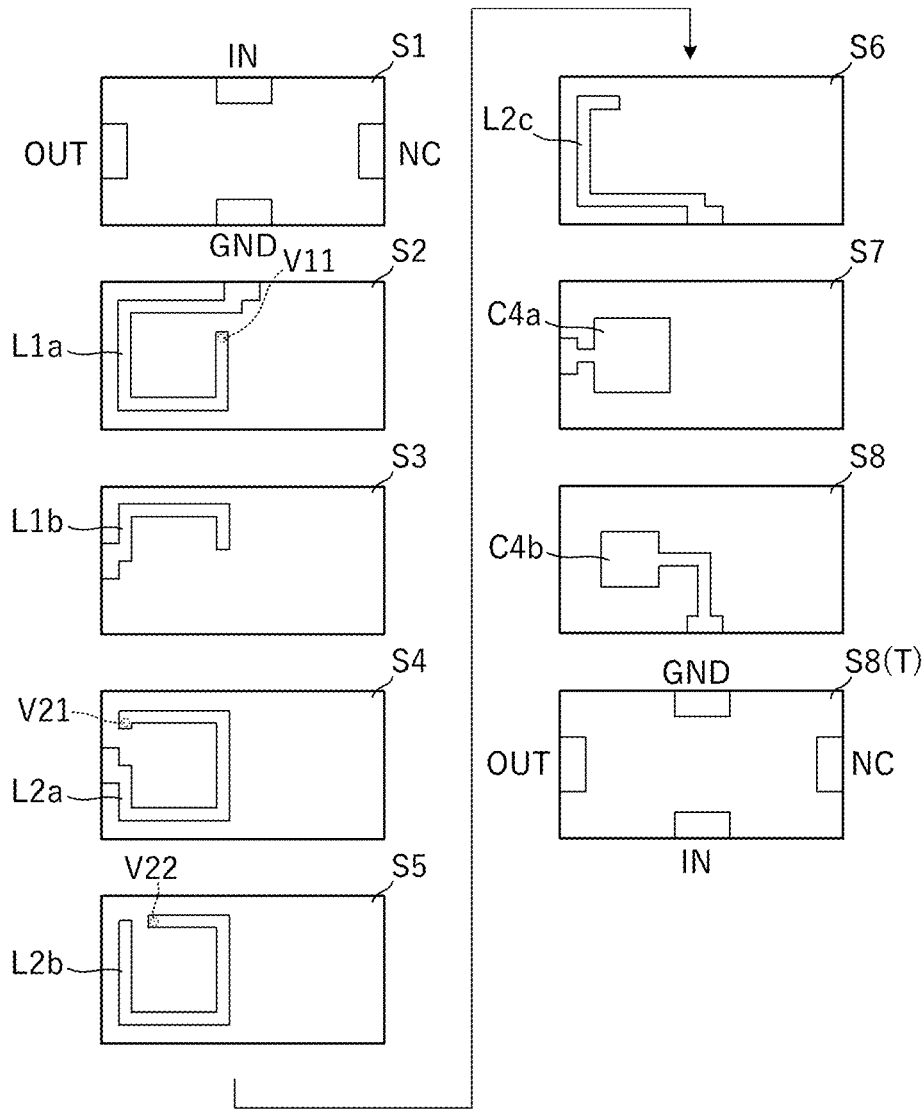
FIG. 16 is an exploded plan view of a filter circuit element according to a 10th preferred embodiment of the present invention.
Figure 17:
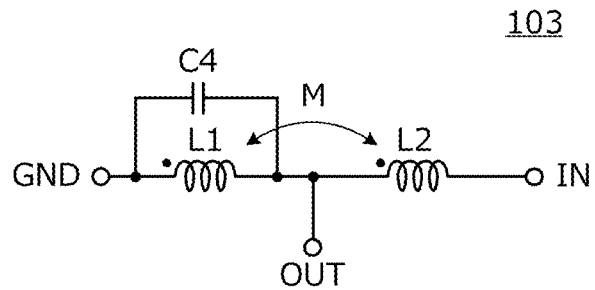
FIG. 17 is a circuit diagram of a filter circuit element 103 according to the 10th preferred embodiment of the present invention.

FIG. 16 is an exploded plan view of a filter circuit element according to the 10th preferred embodiment. FIG. 17 is a circuit diagram of a filter circuit element 103.

The filter circuit element 103 defines the first inductor L1, the second inductor L2, and the fourth capacitor C4 in the high pass filter 14 shown in FIG. 6A, the high pass filter 16 shown in FIG. 8A, and the like. An external appearance of the filter circuit element 103 is the same as or similar to that shown in FIG. 11.

As shown in FIG. 16, the filter circuit element 103 is a multilayer body including insulating substrates S1 to S8 that are laminated. In FIG. 16, a lower surface of each of the insulating substrates S1 to S8 is shown. In FIG. 16, an insulating substrate S8(T) shows an upper surface of the insulating substrate S8.

As shown in FIG. 16, conductor patterns L1a and L1b that define a first inductor are provided on the insulating substrates S2 and S3. Conductor patterns L2a, L2b, and L2c that define a second inductor are provided on the insulating substrates S4, S5, and S6. Further, conductor patterns C4a and C4b that define a fourth capacitor are provided on the insulating substrates S7 and S8.

The plurality of conductor patterns L1a, L1b, L2a, L2b, and L2c overlap one another when viewed from a laminating direction of the insulating substrates S1 to S6. That is, an opening of a loop defining the first inductor L1 and an opening of a loop defining the second inductor L2 overlap each other. Additionally, the conductor pattern L1a and the conductor pattern L1b are electrically connected to each other via an interlayer connection conductor V11, and the first inductor L1 is defined by the conductor patterns L1a and L1b and the interlayer connection conductor V11. Further, the conductor pattern L2a and the conductor pattern L2b are electrically connected to each other via an interlayer connection conductor V21, and the conductor pattern L2b and the conductor pattern L2c are electrically connected to each other via an interlayer connection conductor V22, and the second inductor L2 is formed by the conductor patterns L2a, L2b, and L2c and the interlayer connection conductors V21 and V22.

The conductor patterns C4a and C4b that define the fourth capacitor are opposed to each other to define the fourth capacitor C4.

According to the 10th preferred embodiment, an element incorporating the fourth capacitor C4 together with the first inductor L1 and the second inductor L2, which are magnetic-field-coupled to each other, is able to be treated as a single component, and the filter circuit is able to be provided with a small number of components.

Eleventh Preferred Embodiment

In an 11th preferred embodiment of the present invention, an example of a filter circuit element including a capacitor electrically connected in parallel to the first inductor L1 and a capacitor electrically connected in series to the second inductor L2 is described.

Figure 18:
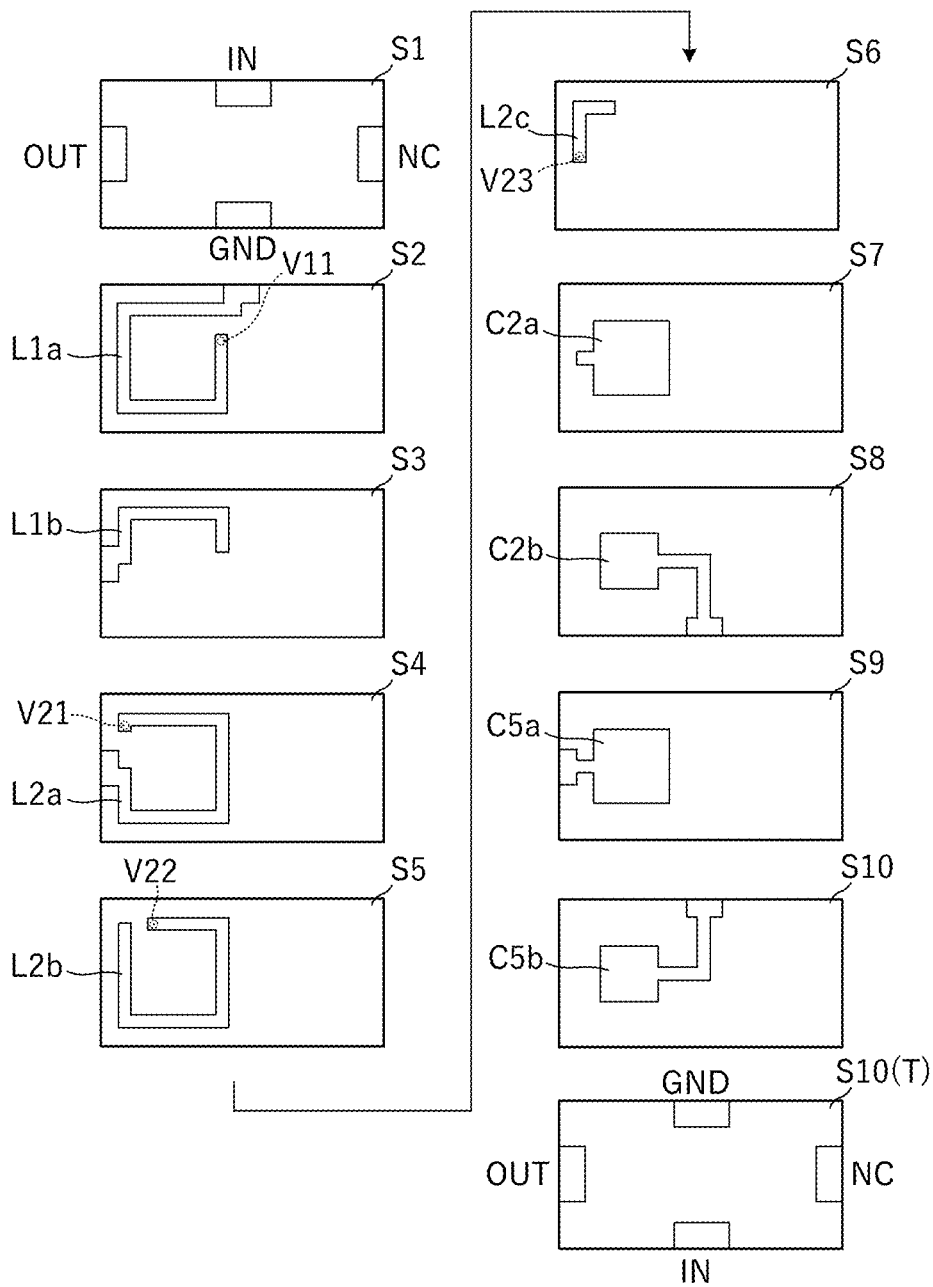
FIG. 18 is an exploded plan view of a filter circuit element according to an 11th preferred embodiment of the present invention.
Figure 19:
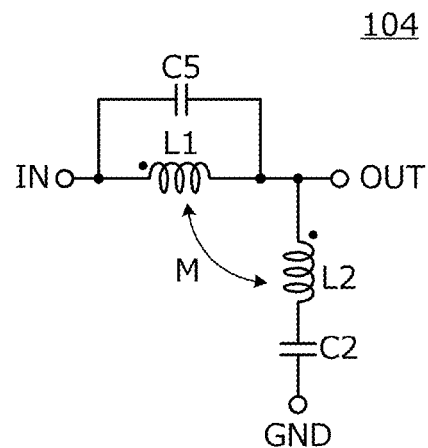
FIG. 19 is a circuit diagram of a filter circuit element 104 according to the 11th preferred embodiment of the present invention.

FIG. 18 is an exploded plan view of a filter circuit element according to the 11th preferred embodiment. FIG. 19 is a circuit diagram of a filter circuit element 104.

The filter circuit element 104 defines the first inductor L1, the second inductor L2, the second capacitor C2, and the fifth capacitor C5 in the low pass filter 15 shown in FIG. 7A and the like. An external appearance of the filter circuit element 104 is the same as or similar to that shown in FIG. 11.

As shown in FIG. 18, the filter circuit element 104 is a multilayer body having insulating substrates S1 to S10 laminated. In FIG. 18, a lower surface of each of the insulating substrates S1 to S10 is shown. In FIG. 18, an insulating substrate S10(T) shows an upper surface of the insulating substrate S10.

As shown in FIG. 18, conductor patterns L1a and L1b that define a first inductor are provided on the insulating substrates S2 and S3. Conductor patterns L2a, L2b, and L2c that define a second inductor are provided on the insulating substrates S4, S5, and S6. Additionally, conductor patterns C2a and C2b that define a second capacitor are provided on the insulating substrates S7 and S8. Further, conductor patterns C5a and C5b that define a fifth capacitor are provided on the insulating substrates S9 and S10.

The plurality of conductor patterns L1a, L1b, L2a, L2b, and L2c overlap one another when viewed from a laminating direction of the insulating substrates S1 to S6. That is, an opening of a loop defining the first inductor L1 and an opening of a loop defining the second inductor L2 overlap each other. Additionally, the conductor pattern L1a and the conductor pattern L1b are electrically connected to each other via an interlayer connection conductor V11, and the first inductor L1 is define by the conductor patterns L1a and L1b and the interlayer connection conductor V11. Further, the conductor pattern L2a and the conductor pattern L2b are electrically connected to each other via an interlayer connection conductor V21, and the conductor pattern L2b and the conductor pattern L2c are electrically connected to each other via an interlayer connection conductor V22, and the second inductor L2 is defined by the conductor patterns L2a, L2b, and L2c and the interlayer connection conductors V21 and V22. Further, the conductor pattern L2c and the conductor pattern C2a are electrically connected to each other via an interlayer connection conductor V23.

The conductor patterns C2a and C2b that define the second capacitor are opposed to each other to define the second capacitor C2. Further, the conductor patterns C5a and C5b that define the fifth capacitor are opposed to each other to define the fifth capacitor C5.

According to the 11th preferred embodiment, an element incorporating the second capacitor C2 and the fifth capacitor C5 together with the first inductor L1 and the second inductor L2, which are magnetic-field-coupled to each other, is able to be treated as a single component, and the filter circuit is able to be provided with a small number of components.

Twelfth Preferred Embodiment

In a 12th preferred embodiment of the present invention, an example of a filter circuit element including a capacitor electrically connected in parallel to the first inductor L1 and a capacitor electrically connected in parallel to the second inductor L2 is described.

Figure 20:
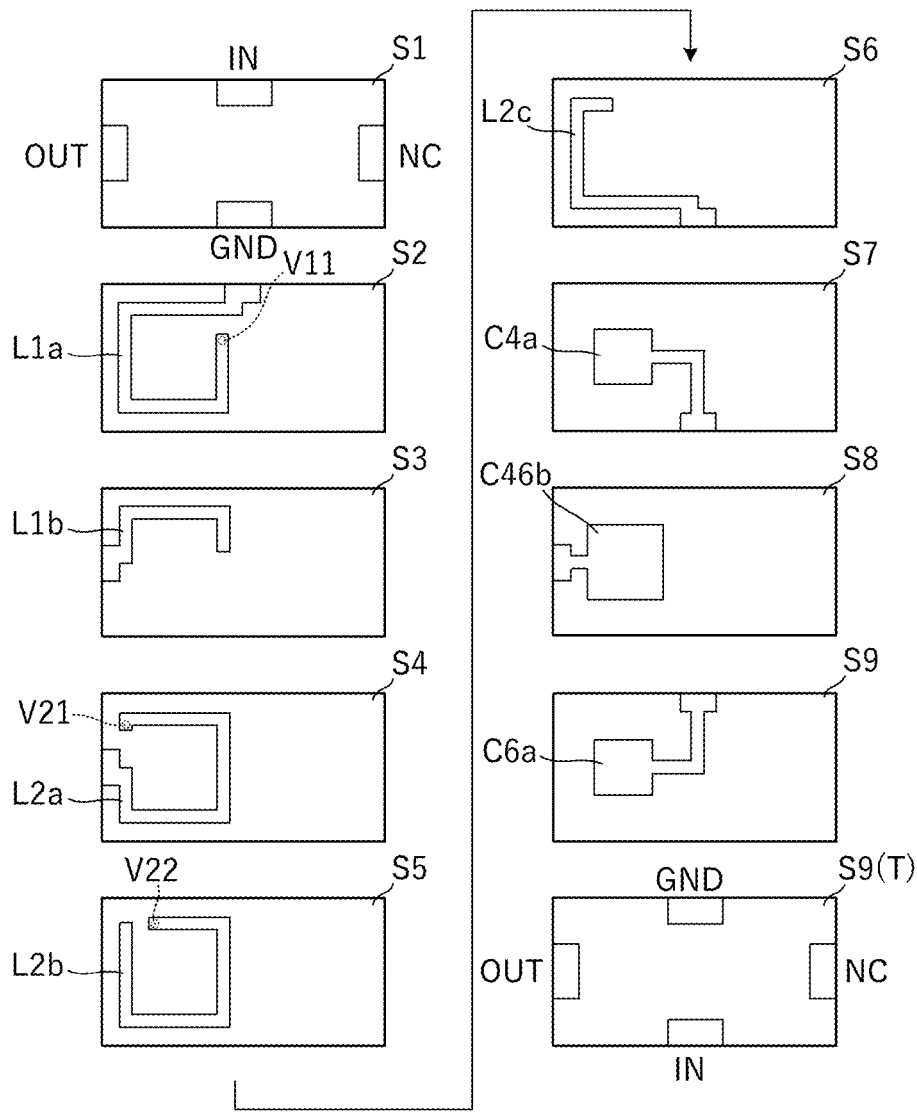
FIG. 20 is an exploded plan view of a filter circuit element according to a 12th preferred embodiment of the present invention.
Figure 21:
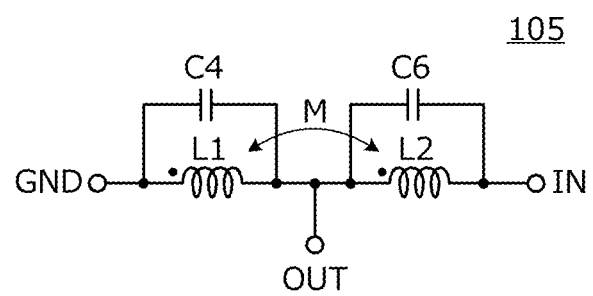
FIG. 21 is a circuit diagram of a filter circuit element 105 according to the 12th preferred embodiment of the present invention.

FIG. 20 is an exploded plan view of a filter circuit element according to the 12th preferred embodiment. FIG. 21 is a circuit diagram of a filter circuit element 105.

The filter circuit element 105 is a filter circuit element forming the first inductor L1, the second inductor L2, the fourth capacitor C4, and the sixth capacitor C6 in the high pass filter 16 shown in FIG. 8A and the like. An external appearance of the filter circuit element 105 is the same as or similar to that shown in FIG. 11.

As shown in FIG. 20, the filter circuit element 105 is a multilayer body having insulating substrates S1 to S9 laminated. In FIG. 20, a lower surface of each of the insulating substrates S1 to S9 is shown. In FIG. 20, an insulating substrate S9(T) shows an upper surface of the insulating substrate S9.

As shown in FIG. 20, conductor patterns L1a and L1b that define a first inductor are provided on the insulating substrates S2 and S3. Conductor patterns L2a, L2b, and L2c that define a second inductor are provided on the insulating substrates S4, S5, and S6. Further, one conductor pattern C4a that define a fourth capacitor is provided on the insulating substrate S7. One conductor pattern C6a that define a sixth capacitor is provided on the insulating substrate S9. Another conductor pattern C46b that define the fourth capacitor and the sixth capacitor is provided on the insulating substrate S8. That is, the fourth capacitor C4 is provided by opposing the conductor pattern C4a to the conductor pattern C46b, and the sixth capacitor C6 is provided by opposing the conductor pattern C6a to the conductor pattern C46b.

The plurality of conductor patterns L1a, L1b, L2a, L2b, and L2c overlap one another when viewed from a laminating direction of the insulating substrates S1 to S6. That is, an opening of a loop defining the first inductor L1 and an opening of a loop defining the second inductor L2 overlap each other. Additionally, the conductor pattern L1a and the conductor pattern L1b are electrically connected to each other via an interlayer connection conductor V11, and the first inductor L1 is defined by the conductor patterns L1a and L1b and the interlayer connection conductor V11. Further, the conductor pattern L2a and the conductor pattern L2b are electrically connected to each other via an interlayer connection conductor V21, and the conductor pattern L2b and the conductor pattern L2c are electrically connected to each other via an interlayer connection conductor V22, and the second inductor L2 is defined by the conductor patterns L2a, L2b, and L2c and the interlayer connection conductors V21 and V22.

According to the 12th preferred embodiment, an element incorporating the fourth capacitor C4 and the sixth capacitor C6 together with the first inductor L1 and the second inductor L2, which are magnetic-field-coupled to each other, is able to be treated as a single component, and the filter circuit is able to be provided with a small number of components.

Other Preferred Embodiments

In each of the preferred embodiments of the present invention described above, the T-type one-stage filter (one-unit) including two reactance circuits electrically connected in series and one reactance circuit shunt-connected between the node of the two reactance circuits and the ground is described, but it is also possible to form a T-type multi-stage filter.

In the seventh preferred embodiment, the diplexer for multi/demultiplexing two communication signals of the low-band and the high-band is described. However, it is also applicable to a multiplexer for multi/demultiplexing three or more communication signals.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter circuit element comprising:
    a first inductor;
    a second inductor magnetic-field-coupled to the first inductor; and
    a resonant circuit connection end electrically connected to a parallel resonant circuit; wherein
    the first inductor and the second inductor are provided in a multilayer body including a plurality of insulating substrates;
    the first inductor and the second inductor include a plurality of conductor patterns provided in the plurality of insulating substrates;
    the plurality of conductor patterns overlap one another when viewed from a laminating direction of the plurality of insulating substrates;
    one end of the first inductor and one end of the second inductor are electrically connected to the resonant circuit connection end;
    a negative mutual inductance is generated at a resonant circuit connection end side; and
    an output terminal of the filter circuit element which is a connection end between the first inductor and the second inductor defines the resonant circuit connection end.

2. The filter circuit element according to claim 1, further comprising a capacitor electrically connected to the first inductor or the second inductor in series or in parallel.

3. A filter circuit comprising:
    a first port;
    a second port;
    a ground terminal;
    a first inductor electrically connected between the first port and the second port;
    a second inductor electrically connected between the first inductor and the second port and magnetic-field-coupled to the first inductor;
    a third inductor electrically connected between a node between the first inductor and the second inductor, and the ground terminal; and
    a third capacitor electrically connected in parallel to the third inductor and defining a second parallel resonant circuit together with the third inductor; wherein
    the first inductor and the second inductor are additive-polarity-coupled to each other; and
    a negative inductance is generated between the node and the third inductor.

4. The filter circuit according to claim 3, further comprising a fourth capacitor electrically connected in parallel to the first inductor and defining a third parallel resonant circuit together with the first inductor and a mutual inductance due to the magnetic field coupling.

5. The filter circuit according to claim 3, further comprising a sixth capacitor electrically connected in parallel to the second inductor and defining a fifth parallel resonant circuit together with the second inductor and a mutual inductance due to the magnetic field coupling.

6. A filter circuit comprising:
    a first port;
    a second port;
    a ground terminal;
    a first inductor electrically connected between the first port and the second port;
    a second inductor electrically connected between a node between the first inductor and the second port, and the ground terminal, and magnetic-field-coupled to the first inductor;
    a third inductor electrically connected between the second inductor and the second port; and
    a first capacitor electrically connected in parallel to the third inductor and defining a first parallel resonant circuit together with the third inductor; wherein
    the first inductor and the second inductor are additive-polarity-coupled to each other; and
    a negative inductance is generated between the node and the second port.

7. The filter circuit according to claim 6, wherein the filter circuit is a low pass filter.

8. The filter circuit according to claim 6, wherein the first capacitor and the third inductor define a first parallel resonant circuit.

9. The filter circuit according to claim 8, wherein a frequency of the first parallel resonant circuit is within a stop frequency band.

10. The filter circuit according to claim 9, wherein the frequency of the first parallel resonant circuit is about 3.3 GHz.

11. The filter circuit according to claim 6, wherein the negative inductance is electrically connected in series to the third inductor.

12. The filter circuit according to claim 6, further comprising a fifth capacitor electrically connected in parallel to the first inductor and defining a fourth parallel resonant circuit together with the first inductor and a mutual inductance due to the magnetic field coupling.

13. The filter circuit according to claim 6, wherein
    the first inductor and the second inductor are provided in a multilayer body including a plurality of insulating substrates;

the first inductor and the second inductor include a plurality of conductor patterns provided in the plurality of insulating substrates; and the plurality of conductor patterns overlap one another when viewed from a laminating direction of the plurality of insulating substrates.

14. The filter circuit according to claim 6, further comprising a second capacitor electrically connected in series to the second inductor and defining a series resonant circuit together with the second inductor.

15. The filter circuit according to claim 14, wherein a mutual inductance is provided between the first inductor and the second inductor; and the second capacitor and a combined inductance of the second inductor and the mutual inductance define a series resonant circuit.

16. The filter circuit according to claim 15, wherein a frequency of the series resonant circuit is within a stop frequency band.

17. The filter circuit according to claim 16, wherein the frequency of the series resonant circuit is about 2.2 GHz.

* * * * *